United States Patent
Nakada et al.

(10) Patent No.: US 11,538,974 B2
(45) Date of Patent: Dec. 27, 2022

(54) MAGNESIUM-BASED THERMOELECTRIC CONVERSION MATERIAL, MAGNESIUM-BASED THERMOELECTRIC CONVERSION ELEMENT, THERMOELECTRIC CONVERSION DEVICE, AND METHOD FOR MANUFACTURING MAGNESIUM-BASED THERMOELECTRIC CONVERSION MATERIAL

(71) Applicant: MITSUBISHI MATERIALS CORPORATION, Tokyo (JP)

(72) Inventors: Yoshinobu Nakada, Ageo (JP); Koya Arai, Saitama (JP); Masahito Komasaki, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 606 days.

(21) Appl. No.: 16/084,057

(22) PCT Filed: Mar. 17, 2017

(86) PCT No.: PCT/JP2017/010873
§ 371 (c)(1),
(2) Date: Sep. 11, 2018

(87) PCT Pub. No.: WO2017/159842
PCT Pub. Date: Sep. 21, 2017

(65) Prior Publication Data
US 2020/0303612 A1    Sep. 24, 2020

(30) Foreign Application Priority Data

Mar. 17, 2016  (JP) .............................. JP2016-054116
Feb. 24, 2017  (JP) .............................. JP2017-033836

(51) Int. Cl.
*H01L 35/14* (2006.01)
*H01L 35/04* (2006.01)
(Continued)

(52) U.S. Cl.
CPC ............... *H01L 35/14* (2013.01); *B22F 3/10* (2013.01); *B22F 3/14* (2013.01); *B22F 3/24* (2013.01);
(Continued)

(58) Field of Classification Search
CPC ......... H01L 35/14; H01L 35/04; H01L 35/26; H01L 35/34; B22F 3/10; B22F 3/1017; B22F 3/12; B22F 3/14; B22F 3/24
See application file for complete search history.

(56) References Cited

U.S. PATENT DOCUMENTS 3,256,699 A * 6/1966 Henderson .......... C22C 32/0078
                                                  419/10
2008/0289677 A1* 11/2008 Bell ...................... H01L 35/26
                                                  136/236.1
(Continued)

FOREIGN PATENT DOCUMENTS

CN    101080824 A    11/2007
CN    101197419 A    6/2008
(Continued)

OTHER PUBLICATIONS

Song, R.B. et al., "Synthesis of Mg2Si1-xSnx solid solutions as thermoelectric materials by bulk mechanical alloying and hot pressing", Materials Science and Engineering B 136, pp. 111-117 (Year: 2006).*
(Continued)

*Primary Examiner* — Tamir Ayad
(74) *Attorney, Agent, or Firm* — Locke Lord LLP; James E. Armstrong, IV; Nicholas J. Di Ceglie, Jr.

(57) ABSTRACT

A magnesium-based thermoelectric conversion material includes a first layer formed of $Mg_2Si$ and a second layer
(Continued)

formed of $Mg_2Si_xSn_{1-x}$ (here, x is equal to or greater than 0 and less than 1), in which the first layer and the second layer are directly joined to each other, and within a junction surface with the first layer and in the vicinity of the junction surface, the second layer has a tin concentration transition region in which a tin concentration increases as a distance from the junction surface increases. The junction layer is regarded as a site in which a tin concentration is found to be equal to or lower than a detection limit by the measurement performed using EDX.

3 Claims, 7 Drawing Sheets

(51) Int. Cl.
*H01L 35/26* (2006.01)
*B22F 3/10* (2006.01)
*B22F 3/14* (2006.01)
*B22F 3/24* (2006.01)
*H01L 35/34* (2006.01)

(52) U.S. Cl.
CPC .............. *H01L 35/04* (2013.01); *H01L 35/26* (2013.01); *H01L 35/34* (2013.01); *B22F 2003/247* (2013.01)

(56) References Cited

U.S. PATENT DOCUMENTS

| | | |
|---|---|---|
| 2009/0151766 A1 | 6/2009 | Murai et al. |
| 2010/0051081 A1* | 3/2010 | Iida .................... C04B 35/6265 136/240 |

FOREIGN PATENT DOCUMENTS

| | | |
|---|---|---|
| CN | 101794858 A | 8/2010 |
| CN | 103219456 A | 7/2013 |
| CN | 103700759 A | 4/2014 |
| CN | 105272253 A | 1/2016 |
| EP | 2400572 A1 | 12/2011 |
| JP | H04-101471 A | 4/1992 |
| JP | 2009-164595 A | 7/2009 |
| JP | 2011-216568 A | 10/2011 |
| JP | 2012-533972 A | 12/2012 |
| JP | 2014-086541 A | 5/2014 |
| JP | 2015-110820 A | 6/2015 |
| KR | 10-2013-0130461 A | 12/2013 |
| WO | 2013/047474 A1 | 4/2013 |

OTHER PUBLICATIONS

Müller, E. et al., "Functionally graded materials for sensor and energy applications", Materials Science and Engineering A 362, pp. 17-39. (Year: 2003).*
Liu, Wei et al., "Convergence of Conduction Bands as a Means of Enhancing Thermoelectric Performance of n-Type Mg2Si1-xSnx Solid Solutions", Physical Review Letters, PRL 108, 166601, pp. 1-5. (Year: 2012).*
Solange Vives et al., "Combinatorial Approach Based on Interdiffusion Experiments for the Design of Thermoelectrics Application to the Mg2 (Si,Sn) Alloys," Chemistry of Materials, vol. 26, No. 15, 2014, pp. 4334-4337. (cited in the ISR).
International Search Report dated May 30, 2017, issued for PCT/JP2017/010873.
Supplementary European Search Report dated Sep. 3, 2019, issued for the European patent application No. 17766837.3.
Office Action dated May 27, 2020, issued for Taiwanese patent application No. 106109001 and an English translation of the search report.
Office Action issued in corresponding Chinese Patent Application No. CN 201780016515.2, dated Jun. 16, 2021.

* cited by examiner

MAGNESIUM-BASED THERMOELECTRIC CONVERSION MATERIAL, MAGNESIUM-BASED THERMOELECTRIC CONVERSION ELEMENT, THERMOELECTRIC CONVERSION DEVICE, AND METHOD FOR MANUFACTURING MAGNESIUM-BASED THERMOELECTRIC CONVERSION MATERIAL

TECHNICAL FIELD

The present invention relates to a magnesium-based thermoelectric conversion material having excellent thermoelectric conversion efficiency, a magnesium-based thermoelectric conversion element, a thermoelectric conversion device, and a method for manufacturing a magnesium-based thermoelectric conversion material.

Priorities are claimed on Japanese Patent Application No. 2016-054116, filed on Mar. 17, 2016, and Japanese Patent Application No. 2017-033836, filed on Feb. 24, 2017, the content of which is incorporated herein by reference.

BACKGROUND ART

A thermoelectric conversion element is an electronic element which can carry out interconversion between heat and electricity, known as the Seebeck effect or the Peltier effect. The Seebeck effect is an effect of converting heat energy into electric energy. The Seebeck effect is a phenomenon in which an electromotive force is produced in a case where a temperature difference is caused between both ends of a thermoelectric conversion material. The electromotive force depends on the characteristics of the thermoelectric conversion material. In recent years, thermoelectric generation using the effect has been actively developed (for example, see PATENT DOCUMENT 1).

As an indicator showing the characteristics of the thermoelectric conversion element, a dimensionless figure of merit (ZT) is known. The dimensionless figure of merit (ZT) is represented by the following Equation (1).

$$ZT = S^2 \sigma T / K \tag{1}$$

Here, S represents a Seebeck coefficient, $\sigma$ represents an electric conductivity, T represents an absolute temperature, and K represents a thermal conductivity.

As is evident from Equation (1), a temperature factor is included in the dimensionless figure of merit, and the thermoelectric conversion performance is greatly affected by temperature.

The temperature at which the performance of the thermoelectric conversion element is maximized varies with the material constituting the element.

Accordingly, in a case where the thermoelectric conversion element is prepared using one kind of constituent material, the total amount of power generated due to the temperature distribution caused between a high-temperature side and a low-temperature side becomes the amount of power generated by the thermoelectric conversion element. Consequently, unfortunately, even though the thermoelectric conversion element is formed using a material with high ZT, because the thermoelectric conversion efficiency of the low-temperature side is low, the amount of power generated by the whole thermoelectric conversion element is not necessarily high.

As a measure for improving the decrease in the thermoelectric conversion efficiency resulting from the temperature distribution in one thermoelectric conversion element, a thermoelectric conversion element having a multilayer structure is known in which two or more kinds of different thermoelectric conversion materials are laminated. The thermoelectric conversion element having a multilayer structure is obtained by disposing a thermoelectric conversion material whose ZT is maximized in a high-temperature state on a high-temperature side and a thermoelectric conversion material whose ZT is maximized in a low-temperature state on a low-temperature side, and joining these thermoelectric conversion materials to each other through a conductive junction layer.

CITATION LIST

Patent Document

[PATENT DOCUMENT 1] Published Japanese Translation No. 2012-533972 of the PCT International Publication

DISCLOSURE OF INVENTION

Technical Problem

However, because two or more kinds of different thermoelectric conversion materials are joined to each other through a conductive junction layer in the aforementioned thermoelectric conversion element having a multilayer structure described above, unfortunately, due to the difference in a coefficient of thermal expansion between the junction layer and the thermoelectric conversion materials, peeling easily occurs in the junction portion.

Furthermore, because the thermoelectric conversion element adopts a constitution in which electrodes are disposed in the interface between the different thermoelectric conversion materials so as to take out electricity from the respective thermoelectric conversion materials, the structure is extremely complicated.

The present invention is based on the circumstances described above, and an object thereof is to provide a magnesium-based thermoelectric conversion material exhibiting high thermoelectric conversion efficiency regardless of a temperature distribution and having excellent mechanical strength, a magnesium-based thermoelectric conversion element, a thermoelectric conversion device, and a method for manufacturing a magnesium-based thermoelectric conversion material.

Solution to Problem

In order to achieve the aforementioned object, a magnesium-based thermoelectric conversion material of the present invention includes a first layer formed of $Mg_2Si$, and a second layer formed of $Mg_2Si_xSn_{1-x}$ (here, x is equal to or greater than 0 and less than 1), in which the first layer and the second layer are directly joined to each other, and within a junction surface with the first layer and in the vicinity of the junction surface, the second layer has a tin concentration transition region in which a tin concentration increases as a distance from the junction surface increases.

According to the magnesium-based thermoelectric conversion material of the present invention, by using the thermoelectric conversion material obtained by directly joining the first layer and the second layer to each other in which the dimensionless figure of merit (ZT) of the layers is heightened in different temperature ranges, for example, one surface of the first layer is placed in a high-temperature environment while the other surface of the second layer is placed in a low-temperature temperature, and in this way, the thermoelectric conversion characteristics of each of the first layer and the second layer are exhibited to the maximum. Accordingly, the thermoelectric conversion efficiency (power generation efficiency) of the magnesium-based thermoelectric conversion material can be greatly improved compared to that of a thermoelectric conversion material formed of a material having of single composition.

According to the magnesium-based thermoelectric conversion material of the present invention, the second layer constituting the thermoelectric conversion material has the tin concentration transition region within the junction surface directly joined to the first layer and in the vicinity of the junction surface. Therefore, it is possible to inhibit peeling or cracking from occurring within the junction surface of the first layer and the second layer due the temperature difference between the high-temperature side and the low-temperature side of the thermoelectric conversion material. That is, in the tin concentration transition region, the tin concentration decreases toward the junction surface coming into contact with the first layer, and the composition becomes close to $Mg_2Si$ constituting the first layer. Accordingly, within the junction surface, the composition of the second layer formed of $Mg_2Si_xSn_{1-x}$ (here, x is equal to or greater than 0 and less than 1) becomes close to $Mg_2Si$ forming the first layer. As a result, within the junction surface between the first layer and the second layer, a structure is established in which the first and second layers have the same crystal structure and a portion of Si is substituted with Sn, and a difference in a thermal expansion rate between the first layer and the second layer is extremely small. Therefore, it is possible to reliably inhibit peeling or cracking from occurring within the junction surface due to the temperature difference between the first layer approaching the high-temperature side and the second layer approaching the low-temperature side.

In addition, electrodes do not need to be disposed between the first layer and the second layer and may be disposed only at the end face on the first layer side and the end face on the second layer side. Consequently, the structure becomes extremely simple.

A thickness of the tin concentration transition region in a lamination direction is within a range equal to or greater than 1 μm and equal to or smaller than 50 μm. In a case where the thickness of the tin concentration transition region is less than 1 μm, because the transition region is thin, the joint strength becomes insufficient, and hence cracking or peeling is likely to occur. In a case where the thickness of the tin concentration transition region is greater than 50 μm, the electric resistance may increase due to the diffusion of tin.

In order to determine the thickness of the tin concentration transition region in the lamination direction, the junction interface between the first layer and the second layer of the thermoelectric conversion material is observed using a scanning electron microscope Quanta 450 FEG manufactured by FEI Company by causing the first layer to be on the left side in the field of view for measurement and the second layer to be on the right side in the field of view for measurement. Furthermore, in a field of view (23 μm long and 30 μm wide) at 5,000× magnification, a Sn mapping image is obtained using EDX of a Genesis series manufactured by EDAX. In the image, a region in which the Sn concentration is 0.5% by mass to X % by mass is regarded as a tin concentration transition region, and the area of the region is calculated. Herein, X represents a value which equals 95% of the Sn concentration of the second layer of the thermoelectric conversion material. For determining the Sn concentration of the second layer of the thermoelectric conversion material, in a position 100 μm distant from the junction surface of the first layer and the second layer of the thermoelectric conversion material toward the second layer, a Sn concentration is measured at 10 points by using the same device, and the average is taken as the Sn concentration of the second layer. In addition, the calculated area of the tin concentration transition region is divided by the dimensions of the length and width of the field of view for measurement, and the average of the values obtained from 5 fields of view is taken as the thickness of the tin concentration transition region.

A magnesium-based thermoelectric conversion element of the present invention includes the magnesium-based thermoelectric conversion material described in the above paragraphs, and electrodes joined to one surface and the other surface, facing the one surface, of the magnesium-based thermoelectric conversion material.

According to the magnesium-based thermoelectric conversion element of the present invention, by using the thermoelectric conversion material obtained by directly joining the first layer and the second layer to each other in which the dimensionless figure of merit (ZT) of the layers is heightened in different temperature ranges, for example, one surface of the first layer is placed in a high-temperature environment while the other surface of the second layer is placed in a low-temperature environment, and in this way, the thermoelectric conversion characteristics of each of the first layer and the second layer are exhibited to the maximum. Accordingly, the thermoelectric conversion efficiency (power generation efficiency) of the magnesium-based thermoelectric conversion element can be greatly improved compared to that of a thermoelectric conversion element formed of a material having of single composition.

Furthermore, according to the magnesium-based thermoelectric conversion element of the present invention, the second layer constituting the thermoelectric conversion material has the tin concentration transition region within the junction surface directly joined to the first layer and in the vicinity of the junction surface. Therefore, it is possible to inhibit peeling or cracking from occurring within the junction surface of the first layer and the second layer due the temperature difference between the high-temperature side and the low-temperature side of the thermoelectric conversion material. That is, in the tin concentration transition region, the tin concentration decreases toward the junction surface coming into contact with the first layer, and the composition becomes close to $Mg_2Si$ forming the first layer. Accordingly, within the junction surface, the composition of the second layer formed of $Mg_2Si_xSn_{1-x}$ (here, x is equal to or greater than 0 and less than 1) becomes close to $Mg_2Si$ constituting the first layer. As a result, within the junction surface between the first layer and the second layer, a structure is established in which the first and second layers have the same crystal structure and a portion of Si is substituted with Sn, and a difference in a thermal expansion rate between the first layer and the second layer is extremely small Therefore, it is possible to reliably inhibit peeling or cracking from occurring within the junction surface due to the temperature difference between the first layer approaching the high-temperature side and the second layer approaching the low-temperature side.

A thermoelectric conversion device of the present invention includes a plurality of the magnesium-based thermoelectric conversion elements, in which the magnesium-based thermoelectric conversion elements are arranged to be electrically connected to each other in series through the electrodes.

According to the thermoelectric conversion device of the present invention, by using the thermoelectric conversion material obtained by directly joining the first layer and the second layer to each other in which the dimensionless figure of merit (ZT) of the layers is heightened in different temperature ranges, for example, one surface of the first layer is placed in a high-temperature environment while the other surface of the second layer is placed in a low-temperature environment, and in this way, the thermoelectric conversion characteristics of each of the first layer and the second layer are exhibited to the maximum. Accordingly, the thermoelectric conversion efficiency (power generation efficiency) of the thermoelectric conversion device can be greatly improved compared to that of a thermoelectric conversion device in which a thermoelectric conversion material is formed of a material having of single composition.

Furthermore, according to the thermoelectric conversion device of the present invention, the second layer constituting the thermoelectric conversion material has the tin concentration transition region within the junction surface directly joined to the first layer and in the vicinity of the junction surface. Therefore, it is possible to inhibit peeling or cracking from occurring within the junction surface of the first layer and the second layer due the temperature difference between the high-temperature side and the low-temperature side of the thermoelectric conversion material. That is, in the tin concentration transition region, the tin concentration decreases toward the junction surface coining into contact with the first layer, and the composition becomes close to $Mg_2Si$ constituting the first layer. Accordingly, within the junction surface, the composition of the second layer formed of $Mg_2Si_xSn_{1-x}$ (here, x is equal to or greater than 0 and less than 1) becomes close to $Mg_2Si$ forming the first layer. As a result, within the junction surface between the first layer and the second layer, a structure is established in which the first and second layers have the same crystal structure and a portion of Si is substituted with Sn, and a difference in a thermal expansion rate between the first layer and the second layer is extremely small. Therefore, it is possible to reliably inhibit peeling or cracking from occurring within the junction surface due to the temperature difference between the first layer approaching the high-temperature side and the second layer approaching the low-temperature side.

A method for manufacturing a magnesium-based thermoelectric conversion material of the present invention is a method for manufacturing a magnesium-based thermoelectric conversion material which includes a first layer formed of $Mg_2Si$ and a second layer formed of $Mg_2Si_xSn_{1-x}$ (here, x is equal to or greater than 0 and less than 1) and in which the first layer and the second layer are directly joined to each other, and within a junction surface with the first layer and in the vicinity of the junction surface, the second layer has a tin concentration transition region in which a tin concentration increases as a distance from the junction surface increases, the method including a raw material-forming step of forming a raw material for sintering including a magnesium-based compound, a first sintering step of heating the raw material for sintering at a temperature within a range equal to or higher than 750° C. and equal to or lower than 950° C. while applying pressure equal to or higher than 10 MPa to the raw material for sintering so as to form the first layer, and a second sintering step of disposing the raw material for sintering formed of a mixture of magnesium powder, silicon powder, and tin powder on the junction surface side of the first layer and heating the raw material for sintering at a temperature within a range equal to or higher than 650° C. and equal to or lower than 750° C. while applying pressure equal to or higher than 0.5 MPa to the raw material for sintering so as to form the second layer directly joined to the first layer by liquid phase sintering and to obtain a magnesium-based thermoelectric conversion material.

Furthermore, a method for manufacturing a magnesium-based thermoelectric conversion material of the present invention is a method for manufacturing a magnesium-based thermoelectric conversion material which includes a first layer formed of $Mg_2Si$ and a second layer formed of $Mg_2Si_xSn_{1-x}$ (here, x is equal to or greater than 0 and less than 1) and in which the first layer and the second layer are directly joined to each other, and within a junction surface with the first layer and in the vicinity of the junction surface, the second layer has a tin concentration transition region in which a tin concentration increases as a distance from the junction surface increases, the method including a raw material-forming step of forming a raw material for sintering including a magnesium-based compound, a first sintering step of heating the raw material for sintering at a temperature within a range equal to or higher than 750° C. and equal to or lower than 950° C. while applying pressure equal to or higher than 10 MPa to the raw material for sintering so as to form the first layer, and a second sintering step of disposing the raw material for sintering formed of $Mg_2Si_xSn_{1-x}$ (here, x is equal to or greater than 0 and less than 1) on the junction surface side of the first layer and heating the raw material for sintering at a temperature within a range equal to or higher than 650° C. and equal to or lower than 850° C. while applying pressure equal to or higher than 5 MPa to the raw material for sintering so as to form the second layer directly joined to the first layer by solid phase sintering and to obtain a magnesium-based thermoelectric conversion material.

According to the method for manufacturing a magnesium-based thermoelectric conversion material of the present invention, by forming the first layer through the first sintering step, disposing the raw material for sintering that becomes the second layer on the first layer, and forming the second layer through the second sintering step, it is possible to obtain a thermoelectric conversion material including the first layer and the second layer directly joined to each other in which the dimensionless figure of merit (ZT) of the layers is heightened in different temperature ranges. In the thermoelectric conversion material obtained in this way, for example, by placing one surface of the first layer in a high-temperature environment and placing the other surface of the second layer in a low-temperature environment, the thermoelectric conversion characteristics of each of the first layer and the second layer are exhibited to the maximum.

Accordingly, the thermoelectric conversion efficiency (power generation efficiency) of the magnesium-based thermoelectric conversion material can be greatly improved compared to that of a thermoelectric conversion material formed of a material having of single composition.

The method for manufacturing a magnesium-based thermoelectric conversion material of the present invention further includes a polishing step of polishing the junction surface of the first layer, between the first sintering step and the second sintering step.

In the method for manufacturing a magnesium-based thermoelectric conversion material of the present invention, the first sintering step and the first sintering step are performed by any of a hot pressing method, a hot isostatic pressing method, a discharge plasma sintering method, an energizing sintering method, a hot rolling method, a hot extrusion method, and a hot forging method.

In the method for manufacturing a magnesium-based thermoelectric conversion material of the present invention, during the raw material-forming step, silicon oxide is added in an amount within a range equal to or greater than 0.5 mol % and equal to or smaller than 13.0 mol % to the magnesium-based compound.

Advantageous Effects of Invention

According to the magnesium-based thermoelectric conversion material, the magnesium-based thermoelectric conversion element, the thermoelectric conversion device, and the method for manufacturing a magnesium-based thermoelectric conversion material of the present invention, it is possible to provide a magnesium-based thermoelectric conversion material having high thermoelectric conversion efficiency and excellent mechanical strength and to provide a magnesium-based thermoelectric conversion element and a thermoelectric conversion device in which the magnesium-based thermoelectric conversion material is used.

BEST MODE FOR CARRYING OUT THE INVENTION

Hereinafter, the magnesium-based thermoelectric conversion material, the magnesium-based thermoelectric conversion element, the thermoelectric conversion device, and the method for manufacturing a magnesium-based thermoelectric conversion material according to embodiments of the present invention will be described with reference to drawings. The following embodiments specifically describe the present invention so as to promote understanding of the gist of the present invention, and unless otherwise specified, the present invention is not limited to the embodiments. Furthermore, in the drawings used in the following description, for convenience, main portions are enlarged in some cases so as to promote understanding of the characteristics of the present invention, and the dimensional ratio of each constituent is not the same as the actual one.

(Thermoelectric Conversion Material and Thermoelectric Conversion Element)

Figure 1:
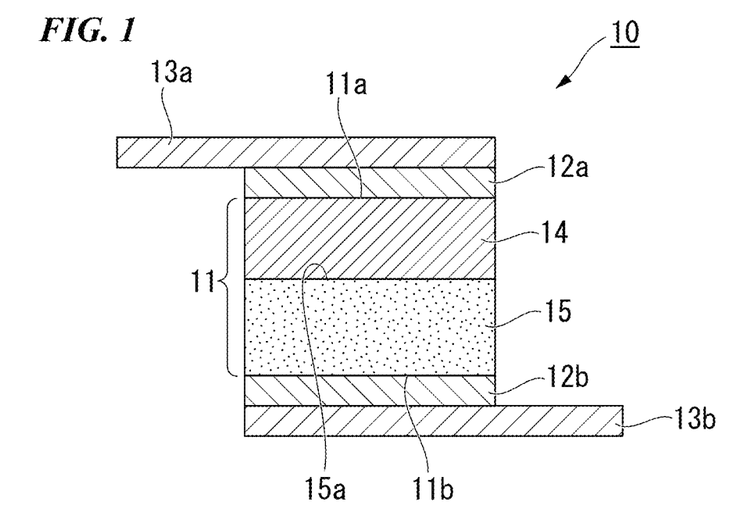
FIG. 1 is a cross-sectional view showing a magnesium-based thermoelectric conversion material of an embodiment of the present invention and a magnesium-based thermoelectric conversion element in which the magnesium-based thermoelectric conversion material is used.
Figure 2:
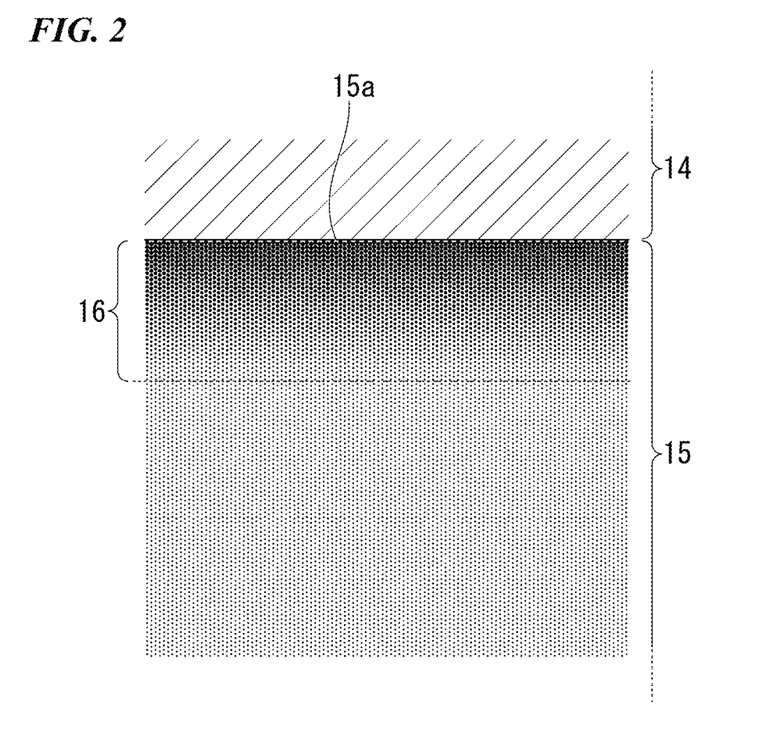
FIG. 2 is an enlarged cross-sectional view of a main portion that shows a junction portion between a first layer and a second layer constituting the thermoelectric conversion material.

FIG. 1 is a cross-sectional view showing a magnesium-based thermoelectric conversion element in which a magnesium-based thermoelectric conversion material of the present embodiment is used. FIG. 2 is an enlarged cross-sectional view of a main portion that shows a junction portion between a first layer and a second layer constituting the magnesium-based thermoelectric conversion material.

In a thermoelectric conversion element 10, metallized layers 12a and 12b are formed on one surface 11a and the other surface 11b, facing the surface 11a, of a magnesium-based thermoelectric conversion material (hereinafter, simply referred to as a thermoelectric conversion material in some cases) 11, respectively, and electrodes 13a and 13b are formed by being superposed on the metallized layers 12a and 12b, respectively.

The thermoelectric conversion material 11 is constituted with a first layer 14 formed of magnesium silicide ($Mg_2Si$) and a second layer 15 formed of $Mg_2Si_xSn_{1-x}$ (here, x is equal to or greater than 0 and less than 1), in which the first layer 14 and the second layer 15 are directly joined to each other. In the present embodiment, after the first layer 14 is formed, the second layer 15 is formed 14 through sintering by being superposed on the first layer. In this way, the first layer 14 and the second layer 15 are directly joined to each other.

As shown in FIG. 2, within a junction surface 15a with the first layer 14 and in the vicinity of the junction surface 15a, the second layer 15 has a tin concentration transition region 16 in which a tin concentration increases as a distance from the junction surface 15a increases, that is, a tin concentration increases toward the other surface 11b of the thermoelectric conversion material 11 that is a surface opposite to the junction surface 15a. The tin concentration transition region 16 is formed such that the thickness thereof in a lamination direction is within a range equal to or greater than 1 µm and equal to or smaller than 50 µm, for example. In the tin concentration transition region 16, as the tin concentration increases, a silicon concentration and a magnesium concentration decrease.

In a case where the thermoelectric conversion material 11 is made into, for example, an n-type semiconductor, antimony (Sb) is added thereto as a dopant. For instance, in a case where 1.3 mol of $SiO_2$ and 0.5 at % of antimony as a pentavalent donor are added to $Mg_2Si$ as the first layer 15 of the thermoelectric conversion material 11, an n-type thermoelectric conversion material having a high carrier density can be obtained. As a donor for making the thermoelectric conversion material 11 into an n-type thermoelectric conversion element, in addition to antimony, bismuth, aluminum, phosphorus, arsenic, and the like can be used.

$Mg_2Si$ forming the first layer 14 of the thermoelectric conversion material 11 is known as a material whose dimensionless figure of merit (ZT) is heightened in a temperature range higher than that of $Mg_2Si_xSn_{1-x}$ (here, x is equal to or greater than 0 and less than 1) forming the second layer 15, for example, at a temperature equal to or higher than 500° C. In contrast, $Mg_2Si_xSn_{1-x}$ (here, x is equal to or greater than 0 and less than 1) forming the second layer 15 is known as a material whose dimensionless figure of merit (ZT) is heightened in a temperature range lower than that of $Mg_2Si$ forming the first layer 15, for example, at a temperature equal to or lower than 500° C.

In a case where the thermoelectric conversion material 11 including the first layer 14 and the second layer 15 directly joined to each other in which the dimensionless figure of merit (ZT) of the layers is heightened in different temperature ranges is used, and, for example, one surface 11*a* of the first layer 14 on the metallized layer 12*a* side is placed in a high-temperature environment while the other surface 11*b* of the second layer 15 on the metallized layer 12*b* side is placed in a low-temperature environment, the thermoelectric conversion characteristics of each of the first layer 14 and the second layer 15 are exhibited to the maximum. As a result, the thermoelectric conversion efficiency (power generation efficiency) of the thermoelectric conversion material can be greatly improved compared to that of a thermoelectric conversion material formed of a material having a single composition.

The second layer 15 has the tin concentration transition region 16 within the junction surface 15*a* directly joined to the first layer 14 and in the vicinity of the junction surface 15*a*. Accordingly, it is possible to inhibit peeling or cracking from occurring within the junction surface of the first layer 14 and the second layer 15 due to the temperature difference between the high-temperature side and the low-temperature side of the thermoelectric conversion material 11. That is, in the tin concentration transition region 16, the tin concentration decreases toward the junction surface 15*a* coming into contact with the first layer 14, and hence the composition becomes close to $Mg_2Si$ constituting the first layer 14.

Consequently, within the junction surface 15*a*, the composition of the second layer 15 formed of $Mg_2Si_xSn_{1-x}$ (here, x is equal to or greater than 0 and less than 1) becomes close to $Mg_2Si$ forming the first layer 14. The junction surface 15*a* is regarded as a site in which the tin concentration is found to be equal to or lower than a detection limit by the measurement performed using EDX (EDX of a Genesis series manufactured by EDAX). As a result, within the junction surface 15*a* between the first layer 14 and the second layer 15, a difference in a thermal expansion rate between the first layer 14 and the second layer 15 is extremely small, and accordingly, it is possible to reliably inhibit peeling or cracking from occurring within the junction surface 15*a* due to the temperature difference between the first layer 14 approaching the high-temperature side and the second layer 15 approaching the low-temperature side.

Figure 3:
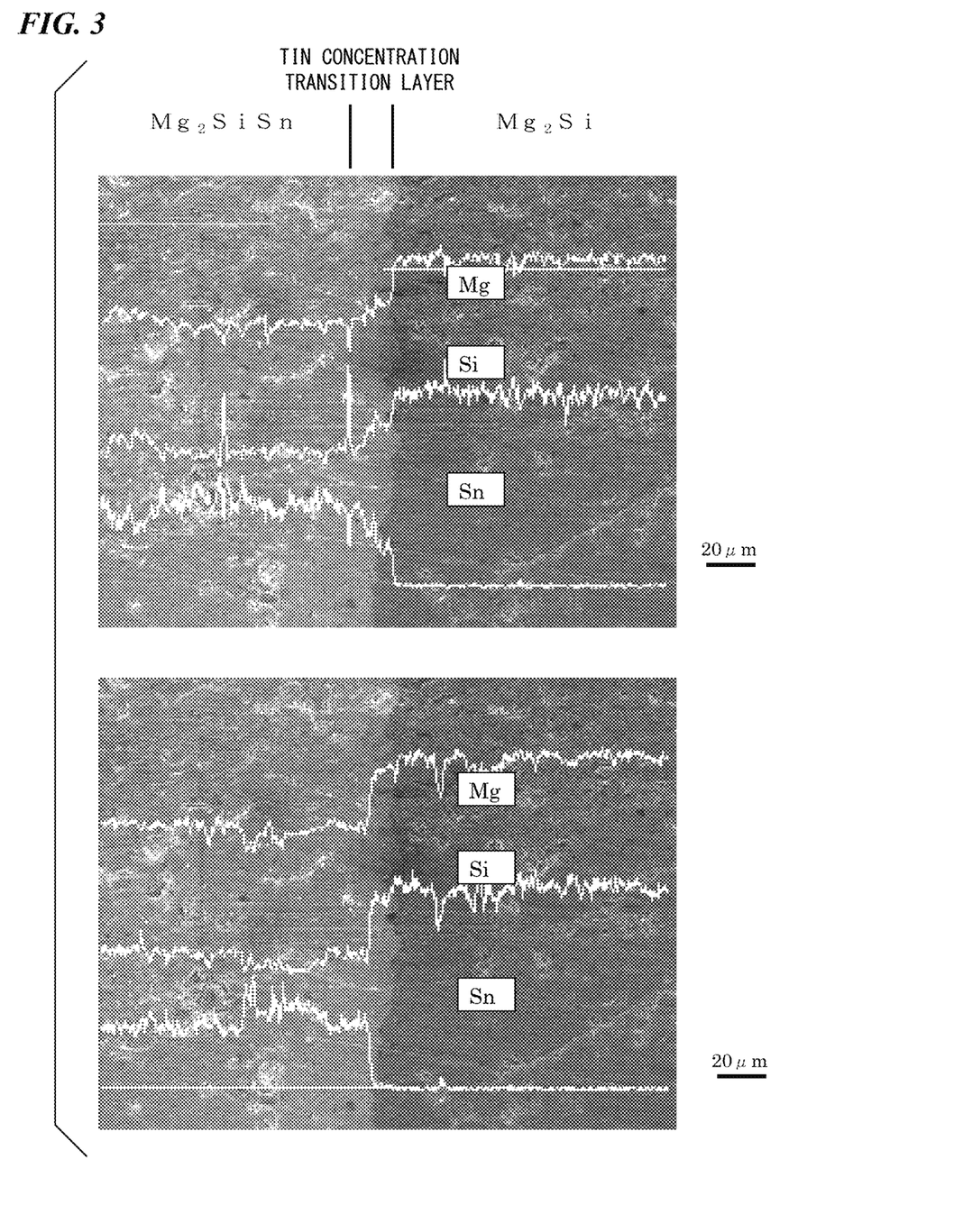
FIG. 3 shows illustrative views obtained by overlapping a graph, which shows a concentration change of Mg, Si, and Sn measured by EDX of a Genesis series manufactured by EDAX, with an image obtained by observing a thermoelectric conversion material by using a scanning electron microscope Quanta 450 FEG manufactured by FEI Company.

FIG. 3 shows views obtained by overlapping a graph, which shows a concentration change of Mg, Si, and Sn measured by EDX of a Genesis series manufactured by EDAX, with an image obtained by observing the thermoelectric conversion material 11 by using a scanning electron microscope Quanta 450 FEG manufactured by FBI Company. In each of the views, two examples obtained from different measurement sites are lined up. The concentration decreases toward the lower portion in the drawing.

From FIG. 3, it is understood that the tin concentration transition region 16 is formed in which the Sn concentration gradually increases toward the other surface 11*b*, which is a surface opposite to the second layer 15, from the junction surface 15*a* between the first layer 14 and the second layer 15 within a thickness range, for example, equal to or greater than 1 μm and equal to or smaller than 50 μm while the concentration of Mg and Si gradually decreases.

In order to determine the thickness of the tin concentration transition region 16, the junction interface between the first layer 14 and the second layer 15 is observed using a scanning electron microscope Quanta 450 FEG manufactured by FEI Company by causing the first layer 14 to be on the left side in the field of view for measurement and the second layer 15 to be on the right side in the field of view for measurement. Furthermore, in a field of view (23 μm long and 30 μm wide) at 5,000× magnification, a Sn mapping image is obtained using EDX of a Genesis series manufactured by EDAX.

In the image, a region which extends toward the second layer 15 from the junction surface 15*a* and in which the Sn concentration is 0.5 wt % to X wt % is regarded as the tin concentration transition region 16, and the area of the region is calculated. Herein, X represents a value which equals 95% of the Sn concentration of the second layer 15. For determining the Sn concentration of the second layer 15, in a position 100 μm distant from the junction surface 15*a* of the first layer 14 and the second layer 15 toward the second layer 15, the Sn concentration is measured at 10 points by using the same device, and the average is taken as the Sn concentration of the second layer 15. In addition, the calculated area of the tin concentration transition region 16 is divided by the dimensions of the length and width of the field of view for measurement, and the average of the values obtained from 5 fields of view is taken as the thickness of the tin concentration transition region 16.

The metallized layers 12*a* and 12*b* are interlayers for joining the electrodes 13*a* and 13*b* to the thermoelectric conversion material 11. As the metallized layers 12*a* and 12*b*, for example, nickel, gold, silver, cobalt, tungsten, molybdenum, and the like can be used. In the present embodiment, nickel is used as the metallized layers 12*a* and 12*b*. The metallized layers 12*a* and 12*b* can be formed by sintering, plating, electrodeposition, and the like.

The electrodes 13*a* and 13*b* are formed of a metal material having excellent conductivity, for example, a plate material such as copper or aluminum. In the present embodiment, as the electrodes, a rolled aluminum plate is used. The metallized layers 12*a* and 12*b* and the electrodes 13*a* and 13*b* can be joined to each other by Ag brazing, Ag plating, and the like.

For example, the thermoelectric conversion element 10 constituted as above can be used as a Seebeck element in which a temperature difference is caused between one surface 11*a* and the other surface 11*b* of the thermoelectric conversion material 11 such that a potential difference is caused between the electrode 13*a* and the electrode 13*b*.

Furthermore, for example, the thermoelectric conversion element 10 can be used as a Peltier element in which a voltage is applied between the electrode 13*a* side and the electrode 13*b* such that a temperature difference is caused between one surface 11*a* and the other surface 11*b* of the thermoelectric conversion material 11. For instance, by allowing an electric current to flow between the electrode 13*a* side and the electrode 13*b*, one surface 11*a* and the other surface 11*b* of the thermoelectric conversion material 11 can be cooled or heated.

(Thermoelectric Conversion Device: First Embodiment)

Figure 4:
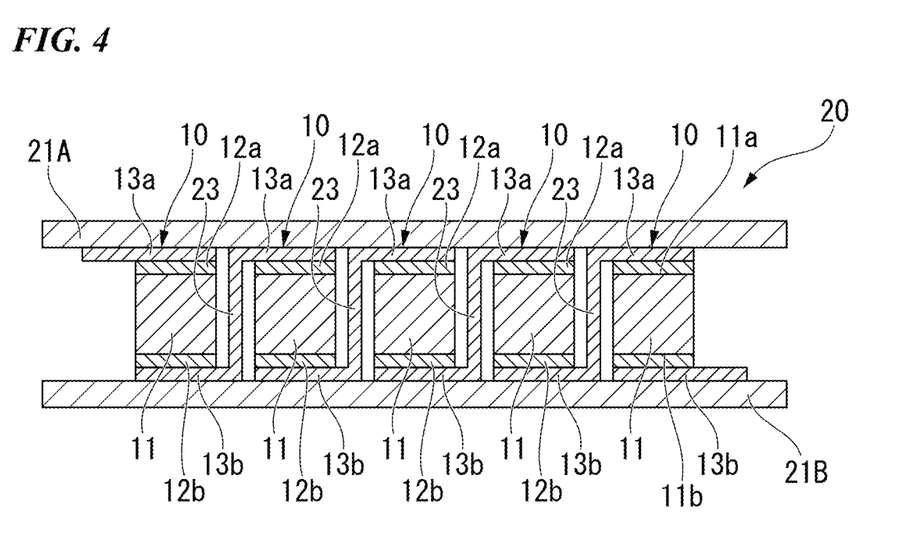
FIG. 4 is a cross-sectional view showing a thermoelectric conversion device of a first embodiment.

FIG. 4 is a cross-sectional view showing a thermoelectric conversion device of a first embodiment.

The thermoelectric conversion device 20 is a unileg-type thermoelectric conversion device.

The thermoelectric conversion device 20 is constituted with a plurality of thermoelectric conversion elements 10, 10, . . . arranged on the same plane and heat transfer plates 21A and 21B disposed on one side and other side of the arranged thermoelectric conversion element 10, 10, . . . respectively.

The thermoelectric conversion elements 10, 10, . . . are formed of the same type of semiconductor, that is, an n-type thermoelectric conversion element doped with a donor such as antimony or a p-type thermoelectric conversion element doped with a dopant such as lithium or silver. In the present embodiment, the thermoelectric conversion elements 10, 10, . . . are n-type thermoelectric conversion elements doped with antimony as a donor.

Each of the thermoelectric conversion elements 10 is constituted with the thermoelectric conversion material 11, the metallized layers 12a and 12b which come into contact with one surface 11a and the other surface 11b of the thermoelectric conversion element 11, respectively, and are formed of nickel, and the electrodes 13a and 13b formed in a state of being superposed on the metallized layers 12a and 12b, respectively. Between the thermoelectric conversion elements 10 and 10 adjacent to each other, the electrode 13a of one thermoelectric conversion element 10 is electrically connected to the electrode 13b of the other thermoelectric conversion element 10 through a connection terminal 23. In reality, the electrode 13a, the connection terminal 23, and the electrode 13b of the thermoelectric conversion elements 10 and 10 adjacent to each other are formed as an integrated electrode plate.

A large number of arranged thermoelectric conversion elements 10, 10, . . . are electrically connected to each other in series. For convenience, FIG. 4 shows only one line of thermoelectric conversion elements 10, 10, . . . so as to clearly describe the elements. However, in reality, a large number of thermoelectric conversion elements 10, 10, . . . are also arranged in the depth direction of the page showing FIG. 4.

The heat transfer plates 21A and 21B are media which apply heat to one surface 11a or the other surface 11b of the thermoelectric conversion material 11 or cause one surface 11a or the other surface 11b of the thermoelectric conversion material 11 to absorb heat. As the heat transfer plates 21A and 21B, it is possible to use an insulating material having excellent thermal conductivity, for example, a plate material such as silicon carbide, silicon nitride, aluminum nitride, or aluminum oxide.

Furthermore, a conductive metal material can be used as the heat transfer plates 21A and 21B, and an insulating layer or the like can be formed between the heat transfer plates 21A and 21B and the electrodes 12a and 12b. Examples of the insulating layer include a resin film or plate, a ceramic thin film or plate, and the like.

In the thermoelectric conversion device 20 of the present embodiment, as the thermoelectric conversion material 11 constituting each of the thermoelectric conversion elements 10, a material obtained by directly joining the first layer 14 and the second layer 15 (see FIG. 2) to each other is used, in which the dimensionless figure of merit (ZT) of the layers is heightened in different temperature ranges. Accordingly, the thermoelectric conversion characteristics of each of the first layer 14 and the second layer 15 are exhibited to the maximum, and the thermoelectric conversion efficiency (power generation efficiency) of the thermoelectric conversion device 20 can be greatly improved compared to that of a thermoelectric conversion device in which a thermoelectric conversion material formed of a material of a single composition is used.

The tin concentration transition region 16 (see FIG. 2) is formed in the second layer 15 of the thermoelectric conversion material 11 constituting each thermoelectric conversion element 10. Accordingly, it is possible to inhibit peeling or cracking from occurring within the junction surface of the first layer 14 and the second layer 15 due to the temperature difference between the high-temperature side and the low-temperature side of the thermoelectric conversion material 11, and to realize the thermoelectric conversion device 20 which has excellent strength as well.

(Thermoelectric Conversion Device: Second Embodiment)

Figure 5:
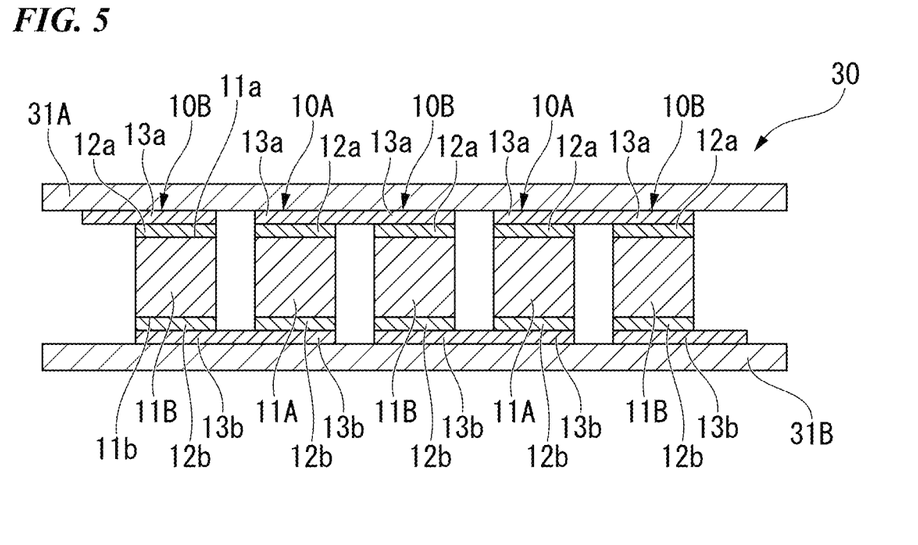
FIG. 5 is a cross-sectional view showing a thermoelectric conversion device of a second embodiment.

FIG. 5 is a cross-sectional view showing a thermoelectric conversion device of a second embodiment.

A thermoelectric conversion device 30 is a π (pi)-type thermoelectric conversion device.

The thermoelectric conversion device 30 is constituted with thermoelectric conversion elements 10A and 10B which are alternately arranged on the same plane and heat transfer plates 31A and 31B which are disposed one side and the other side of the arranged thermoelectric conversion elements 10A and 10B, respectively.

The thermoelectric conversion element 10A is an n-type thermoelectric conversion element having a thermoelectric conversion material 11A doped with a donor such as antimony. The thermoelectric conversion element 10B is a p-type thermoelectric conversion element having a thermoelectric conversion material 11B doped with a dopant such as lithium or silver. Alternatively, the thermoelectric conversion element 10B is $MnSi_{1.73}$ which is a P-type thermoelectric conversion element.

Each of the thermoelectric conversion elements 10A and 10B is constituted with the thermoelectric conversion materials 11A and 11B, the metallized layers 12a and 12b which are connected to one surface 11a and the other surface 11b of the thermoelectric conversion materials 11A and 11B, respectively, and are formed of nickel, and the electrodes 13a and 13b which are formed in a state of being superposed on the metallized layers 12a and 12b, respectively. Between the thermoelectric conversion elements 10A and 10B adjacent to each other, the electrode 13a of the thermoelectric conversion element 10A is electrically connected to the electrode 13a of the thermoelectric conversion element 10B, and the electrode 13b of the thermoelectric conversion element 10B is connected to the electrode 13b of another neighboring thermoelectric conversion element 10A opposite to the aforementioned thermoelectric conversion element 10A.

In reality, the electrodes 13a of the thermoelectric conversion elements 10A and 10B adjacent to each other or the electrodes 13b adjacent to the electrodes 13a are formed as an integrated electrode plate. As the electrode plates, for example, a copper plate or an aluminum plate can be used.

A large number of thermoelectric conversion elements 10A and 10B arranged as above are connected to each other in series such that they are electrically connected to each other. That is, in the π (pi)-type thermoelectric conversion device 30, n-type thermoelectric conversion elements 10A and p-type thermoelectric conversion elements 10B repeatedly alternate with each other and are connected to each other in series. For convenience, FIG. 5 shows only one line of thermoelectric conversion elements 10A and 10B so as to clearly describe the elements. However, in reality, a large number of thermoelectric conversion elements 10A and 10B are also arranged in the depth direction of the page showing FIG. 5.

The heat transfer plates 31A and 31B are media which apply heat to one surface 11a or the other surface 11b of the thermoelectric conversion materials 11A and 11B or cause one surface 11a and the other surface 11b of the thermoelectric conversion materials 11A and 11B to absorb heat. As the heat transfer plates 31A and 31B, an insulating material having excellent thermal conductivity, for example, a plate material such as silicon carbide, silicon nitride, aluminum nitride, or aluminum oxide can be used. Furthermore, a conductive metal material can be used as the heat transfer plates 31A and 31B, and an insulating layer or the like can be formed between the heat transfer plates 31A and 31B and the electrodes 13a and 13b. Examples of the insulating layer include a resin film or plate, a ceramic thin film or plate, and the like.

In the thermoelectric conversion device 30 of the present embodiment, as the thermoelectric conversion materials 11A and 11B constituting the thermoelectric conversion elements 10A and 10B, respectively, a material obtained by directly joining the first layer 14 and the second layer 15 (see FIG. 2) to each other is used, in which the dimensionless figure of merit (ZT) of the layers is heightened in different temperature ranges. Accordingly, the thermoelectric conversion characteristics of each of the first layer 14 and the second layer 15 are exhibited to the maximum, and the thermoelectric conversion efficiency (power generation efficiency) of the thermoelectric conversion device 30 can be greatly improved compared to that of a thermoelectric conversion device in which a thermoelectric conversion material formed of a material of a single composition is used.

The tin concentration transition region 16 (see FIG. 2) is formed in the second layer 15 of the thermoelectric conversion materials 11A and 11B constituting the thermoelectric conversion elements 10A and 10B, respectively. Accordingly, it is possible to inhibit peeling or cracking from occurring within the junction surface of the first layer 14 and the second layer 15 due to the temperature difference between the high-temperature side and the low-temperature side of the thermoelectric conversion material 11, and to realize the thermoelectric conversion device 30 which has excellent strength as well.

(Method for Manufacturing Thermoelectric Conversion Material)

The method for manufacturing a thermoelectric conversion material of the present embodiment will be described.

Figure 6:
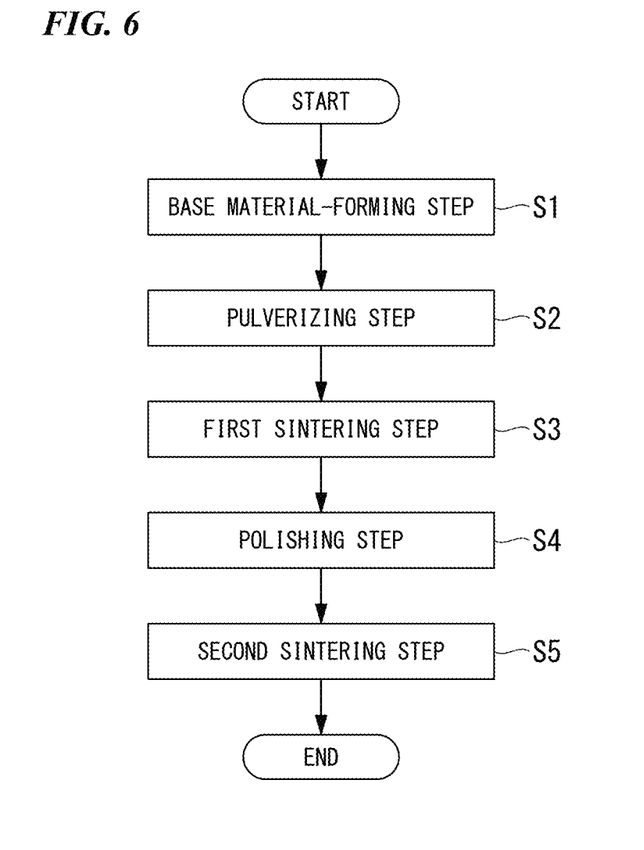
FIG. 6 is a flowchart showing a method for manufacturing a thermoelectric conversion material and a method for manufacturing a thermoelectric conversion element of an embodiment of the present invention in stages.

FIG. 6 is a flowchart showing the method for manufacturing a thermoelectric conversion material of the present embodiment in stages.

For example, for manufacturing the thermoelectric conversion material 11 shown in FIG. 1, first, a magnesium-based compound that becomes a base material (matrix) of the first layer 14 forming the thermoelectric conversion material 11 is manufactured (raw material-forming step S1).

In the present embodiment, as magnesium silicide ($Mg_2Si$), for example, magnesium powder, silicon powder, and a dopant are each measured and mixed together. For instance, in a case where an n-type thermoelectric conversion material is formed, a pentavalent material such as antimony or bismuth or aluminum is mixed as a dopant, and in a case where a p-type thermoelectric conversion material is formed, a material such as lithium or silver is mixed as a dopant.

In the present embodiment, in order to obtain an n-type thermoelectric conversion material, antimony is used as a dopant, and the amount thereof added is set to be 0.5 at %. The amount of antimony added is a ratio of the amount of the added antimony to a $Mg_2Si$ solid obtained after solidification. The mixed powder is put into, for example, an alumina crucible and heated at a temperature of about 800° C. to 1150° C. In this way, a $Mg_2Si$ solid in the form of, for example, a lump is obtained. At the time of heating, a small amount of magnesium is sublimated. Therefore, at the time of measuring the raw materials, it is preferable to add magnesium, for example, about 5% more for the stoichiometric composition of Mg:Si=2:1.

Then, the obtained $Mg_2Si$ in the form of a solid is pulverized by a pulverizer such that the grain diameter thereof becomes 10 µm to 75 µm, thereby forming $Mg_2Si$ in the form of fine powder (pulverizing step S2).

Furthermore, silicon oxide can also be added to the obtained $Mg_2Si$. The addition of the silicon oxide increases the hardness or the power generation efficiency of the obtained thermoelectric conversion material. In a case where the silicon oxide is added, it is possible to use $SiO_x$ (x=1 to 2) such as amorphous $SiO_2$, cristobalite, quartz, tridymite, coesite, stishovite, seifertite, or shocked quartz. The mixing amount of the silicon oxide may be within a range equal to or greater than 0.5 mol % and equal to or smaller than 13.0 mol %, and more preferably within a range equal to or greater than 0.7 mol % and equal to or smaller than 7 mol %. The silicon oxide may be in the form of powder having a grain diameter of 1 µm to 100 µm. In the present embodiment, as the silicon oxide, $SiO_2$ powder having a median grain diameter of 20 µm is added.

In a case where $Mg_2Si$ powder that is already on the market or $Mg_2Si$ powder to which a dopant is added is used, the steps (the base material-forming step S1 and the pulverizing step S2) performed until the aforementioned $Mg_2Si$ powder is formed can be omitted.

The raw material powder formed of the $Mg_2Si$ powder and the $SiO_2$ powder obtained as above is sintered by heating (first sintering step S3). For sintering the raw material powder, for example, an energizing sintering apparatus is used.

Figure 7:
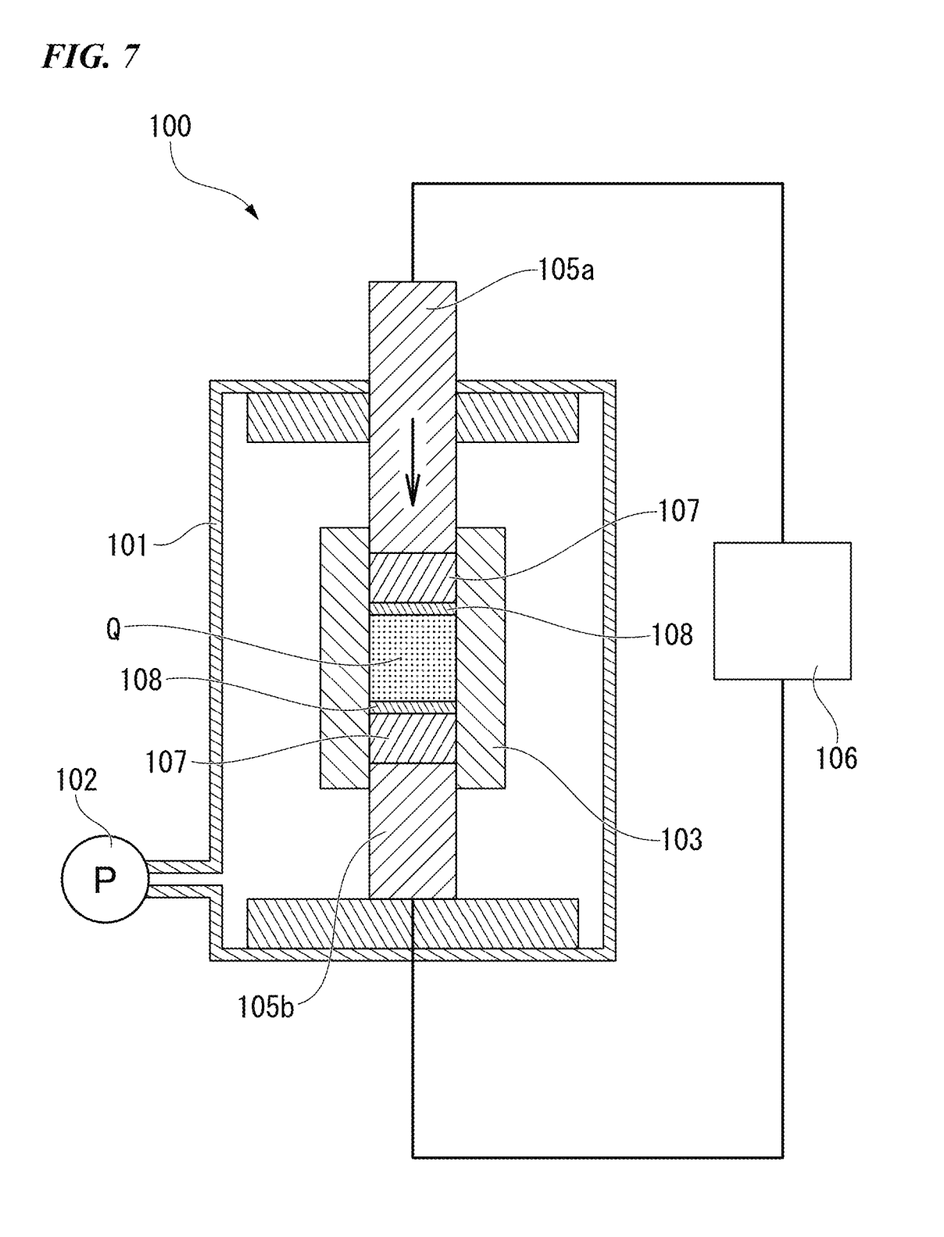
FIG. 7 is a cross-sectional view showing an example of an energizing sintering apparatus.

FIG. 7 is a cross-sectional view showing an example of the energizing sintering apparatus. The energizing sintering apparatus 100 includes, for example, a pressure-resistant housing 101, a vacuum pump 102 which reduces the internal pressure of the pressure-resistant housing 101, a carbon mold 103 which is disposed in the pressure-resistant housing 101 and in the form of a hollow cylinder, a pair of electrodes 105a and 105b which applies an electric current while applying pressure to raw material powder Q with which the carbon mold 103 is filled, and a power source device 106 which applies a voltage between the pair of electrodes 105a and 105b. Between the electrodes 105a and 105b and the raw material powder Q, a carbon plate 107 and a carbon sheet 108 are provided, respectively. The energizing sintering apparatus 100 also includes, in addition to these, a thermometer, a displacement meter, and the like not shown in the drawing.

The carbon mold 103 of the energizing sintering apparatus 100 constituted as above is filled with raw material powder. The inside of the carbon mold 103 is covered with, for example, a graphite sheet or a carbon sheet. By using the power source device 106, a direct current is allowed to flow between the pair of electrodes 105a and 105b such that the raw material powder is heated by self-heating caused by the flow of electric current in the powder. Furthermore, between the pair of electrodes 105a and 105b, the electrode 105a on the movable side is moved toward the raw material powder, and a predetermined pressure is applied to the raw material powder between the electrode 105a and the electrode 105b on the fixed side. In this way, by using the self-heating caused by the electric current directly applied to the sample and the application of pressure as a driving force for sintering, energizing sintering is performed on the raw material powder.

As the sintering conditions, the applied pressure is set to be equal to or higher than 10 MPa and equal to or lower than 70 MPa, and the maximum temperature at the time of heating is set to be equal to or higher than 750° C. and equal to or lower than 950° C.

The holding time at the maximum temperature may be equal to or longer than 0 seconds and equal to or shorter than 10 minutes, and the cooling rate may be equal to or higher than 10° C./min and equal to or lower than 50° C./min.

The heating rate may be equal to or higher than 10° C./min and equal to or lower than 100° C./min. In a case where the heating rate is equal to or higher than 10° C./min and equal to or lower than 100° C./min, the raw material can be sintered within a relatively short period of time, and the reaction between the residual oxygen and the high-concentration silicon region can be inhibited, and hence the oxidation of the high-concentration silicon region can be inhibited. The internal atmosphere of the pressure-resistant housing 101 may be an inert atmosphere such as an argon atmosphere or a vacuum atmosphere. In a case where the vacuum atmosphere is adopted, the pressure may be equal to or lower than 5 Pa.

The first layer 14 constituting the thermoelectric conversion material, which is a sintered material obtained after sintering, is in the form of a cylinder having a size of 30 mm (diameter)×5 mm (thickness), for example.

Then, one surface side (surface coming into contact with the junction surface with the second layer) of the sintered substance which is obtained in the form of a cylinder and forms the first layer 14 is polished using a sample-polishing machine, for example (polishing step S4). In this way, one surface side of the sintered substance forming the first layer 14 is smoothened. During the polishing, by using a rotary polishing machine to which #220 polishing paper is bonded, the carbon sheet remaining on the surface or a processed and altered layer on the surface is removed in a dry state, and then polishing is performed using #320 polishing paper in a dry state.

Thereafter, the sintered substance forming the first layer 14 having undergone polishing of one surface side is inserted again into the carbon mold 103 of the energizing sintering apparatus 100 shown in FIG. 7 by causing the polished surface side to face up. Then, in a state of being superposed on the polished surface of the sintered substance forming the first layer 14, the mixture as the raw material powder of the second layer 15 is introduced into the carbon mold 103.

As the raw material powder (mixture) of the second layer 15, for example, a powder was used which was obtained by measuring 4.4444 g of magnesium powder (purity: 99.99%, grain diameter: 180 µm), 1.019 g of silicon powder (purity: 99.9999%, grain diameter: 45 µm), 6.474 g of tin powder (purity: 99.9999%, grain diameter: 63 µm), and 0.055 g of antimony powder (purity: 99.999%, grain diameter: 45 µm) as a dopant and stirring these powders for 20 minutes in a mortar.

Subsequently, by using the energizing sintering apparatus 100, the second layer 15 was formed by sintering in a state of being superposed on the first layer 14 (second sintering step S5). As the sintering conditions, the applied pressure is set to be equal to or higher than 0.5 MPa and equal to or lower than 30 MPa, and the maximum temperature at the time of heating is set to be equal to or higher than 650° C. and equal to or lower than 750° C. Furthermore, the holding time at the maximum temperature may be set to be equal to or longer than 0 seconds and equal to or shorter than 10 minutes, and the cooling rate may be set to be equal to or higher than 10° C./min and equal to or lower than 50° C./min. In the second sintering step S5, it is preferable to apply pressure by slowly increasing the applied pressure, such that the pressure reaches the aforementioned range.

In the second sintering step S5, the tin powder, the magnesium powder, and the like are dissolved, and hence a liquid phase is formed. Accordingly, by the liquid phase sintering, the second layer 15 directly joined to the first layer 14 is formed.

In the thermoelectric conversion material 11 including the first layer 14 and the second layer 15 formed as above, the first layer 14 and the second layer 15 are directly joined to each other without the addition of a binder. As a result of observing the vicinity of the junction surface 15a by using SEM, no cracks or cavities were observed, and it was found that the tin concentration transition region 16 having a thickness of about 9 µm was formed.

In the present embodiment, the tin concentration transition region 16 is formed, for example, by a mechanism in which the Sn concentration is lowered in the junction interface between the first layer 14 and the second layer 15 due to the diffusion of Sn to the first layer 14 from the second layer 15.

The compositional ratio in the second layer 15 of the obtained thermoelectric conversion material 11 is Mg:Sn:Si=2:0.63:0.37, which is very close to a calculated compositional ratio Mg:Sn:Si=2:0.60:0.40.

In the present embodiment, an energizing sintering method is used for sintering the raw material powder. However, in addition to this, it is possible to use various pressurizing and heating methods such as a hot pressing method, a hot isostatic pressing method, a discharge plasma sintering method, a hot rolling method, a hot extrusion method, and a hot forging method.

Hitherto, several embodiments of the present invention have been described, but these embodiments are merely examples and do not limit the scope of the present invention. These embodiments can be embodied in various other forms within a range that does not depart from the gist of the present invention, and omission, substitution, and modification can be performed in various ways. These embodiments or the modifications thereof are included in the inventions described in Claims and the scope equivalent to the inventions just as the embodiments or the modifications thereof are included in the scope or the gist of the invention.

Figure 8:
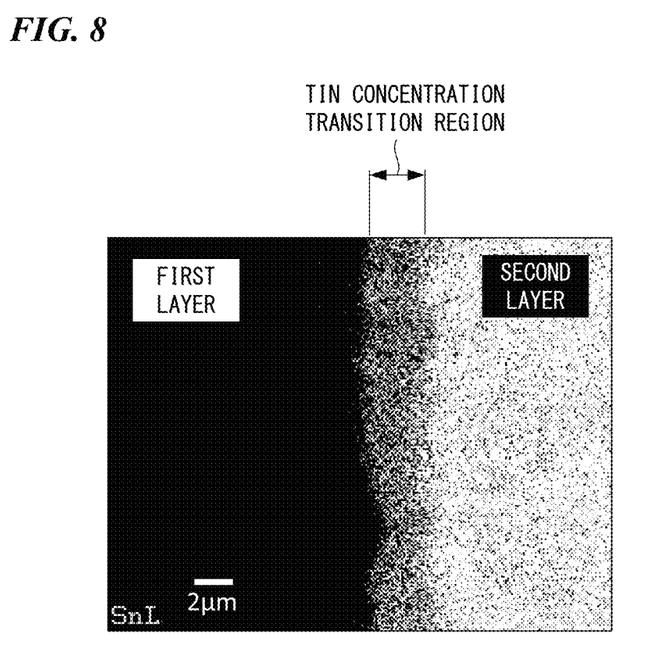
FIG. 8 is a Sn mapping image of a thermoelectric conversion material as another embodiment.

For example, a constitution has been described in which in the second sintering step S5, magnesium powder, silicon powder, tin powder, and antimony powder are used as the mixture, which becomes the raw material powder of the second layer introduced into the carbon mold by being superposed on the sintered substance forming the first layer, so as to form the second layer directly joined to the first layer by liquid phase sintering. However, the present invention is not limited thereto, and a constitution may also be adopted in which a raw material for sintering formed of $Mg_2Si_xSn_{1-x}$ (here, x is equal to or greater than 0 and less than 1) is used as the raw material for sintering of the second layer introduced in a state of being superposed on the sintered substance forming the first layer so as to form the second layer directly joined to the first layer by solid phase sintering. At this time, it is preferable to set the sintering conditions such that the applied pressure becomes equal to or higher than 5 MPa, and the sintering temperature becomes equal to or higher than 650° C. and equal to or lower than 850° C. In this case, the liquid phase does not appear at the time of sintering. Therefore, as shown in FIG. 8, the junction interface between the first layer and the second layer is in the form of a flat surface, and the tin concentration transition region has a relatively small and uniform thickness.

Example

Hereinafter, the results of experiments carried out to check the effects of the present invention will be described.

Mg (grain diameter: 180 μm, manufactured by Kojundo Chemical Lab. Co., Ltd.) having purity of 99.9%, Si (grain diameter: 300 μm, manufactured by Kojundo Chemical Lab. Co., Ltd.) having purity of 99.99%, and Sb (grain diameter: 300 μm, manufactured by Kojundo Chemical Lab. Co., Ltd.) having purity of 99.9% were each measured. These powders were thoroughly mixed together in a mortar, and the mixture was put into an alumina crucible and heated for 2 hours at 850° C. in Ar-5% $H_2$. Considering the loss of Mg from the stoichiometric composition of Mg:Si=2:1 that is caused by the sublimation of Mg, 5% more Mg was mixed in. In this way, a $Mg_2Si$ solid (base material) was obtained.

Then, the $Mg_2Si$ solid (base material) was finely ground in a mortar, and the powder was classified, thereby preparing Sb-doped $Mg_2Si$ powder having a grain diameter equal to or smaller than 75 μm. The Sb-doped $Mg_2Si$ powder was thoroughly mixed with $SiO_2$ (grain diameter: 20 μm, manufactured by TATSUMORI LTD.) at a proportion of 1.3 mol % by using a mortar, thereby obtaining raw material powders.

A carbon mold including a carbon sheet covering the inside thereof was filled with the raw material powders and set in an energizing sintering apparatus, and by performing energizing sintering, a $Mg_2Si$ sintered substance that will become the first layer was prepared. In a vacuum (1 Pa), the raw material powders were heated to 600° C. at a heating rate of 40° C./min under a pressure of 40 MPa applied thereto, then further heated to 950° C. at a heating rate of 30° C./min, and held at 950° C. for 1 minute. The $Mg_2Si$ sintered substance was in the form of a cylinder having a size of 30 mm (diameter)×5 mm (thickness).

In a dry state, one surface of the obtained $Mg_2Si$ sintered substance was polished using a rotary polishing machine by using #220 polishing paper and #320 polishing paper.

In Example 1 of the present invention, on the polished surface of the aforementioned $Mg_2Si$ sintered substance, mixed powder was disposed which was obtained by measuring Mg (grain diameter: 180 μm, manufactured by Kojundo Chemical Lab. Co., Ltd.) having purity of 99.9%, Si (grain diameter: 300 μm, manufactured by Kojundo Chemical Lab. Co., Ltd.) having purity of 99.99%, tin powder (purity: 99.9999%, grain diameter: 63 μm), and Sb (grain diameter: 300 μm, manufactured by Kojundo Chemical Lab. Co., Ltd.) having purity of 99.9% and stirring these powders for 20 minutes in a mortar, and the resultant was set in an energizing sintering apparatus, thereby obtaining a thermoelectric conversion material including a second layer formed of $Mg_2Si_xSn_{1-x}$ (here, x is equal to or greater than 0 and less than 1) that was directly joined to the first layer by liquid phase sintering. As the sintering conditions, the powders were heated to 600° C. in a vacuum (1 Pa) at a heating rate of 40° C./min under a pressure of 0.5 MPa applied thereto, then further heated to 670° C. at a heating rate of 30°/min, and then held at 670° C. for 5 minutes. The thermoelectric conversion material was in the form of a cylinder having a size of 30 mm (diameter)×10 mm (thickness). From the cylindrical sample, a 5 mm×5 mm×7 mm (height) prismatic thermoelectric element was prepared.

In Examples 2 and 3 of the present invention, on one surface of the aforementioned $Mg_2Si$ sintered substance, $Mg_2Si_{0.5}Sn_{0.5}$ powder (grain diameter: 75 μm, manufactured by Mitsuba Corp.) was disposed, and the resultant was set in an energizing sintering apparatus, thereby obtaining a thermoelectric conversion material including a second layer formed of $Mg_2Si_xSn_{1-x}$ (here, x is equal to or greater than 0 and less than 1) that was directly joined to the first layer by solid phase sintering. As the sintering conditions, the powder was heated to 600° C. in a vacuum (1 Pa) at a heating rate of 40° C./min under a pressure of 20 MPa applied thereto and then further heated to 765° C. at a heating rate of 30° C./min. However, the powder was not held at 765° C. The thermoelectric conversion material was in the form of a cylinder having a size of 30 mm (diameter)×10 mm (thickness). From the cylindrical sample, a 5 mm×5 mm×7 mm (height) prismatic thermoelectric element was prepared.

In the comparative example, under the same conditions as those for preparing the $Mg_2Si$ sintered substance that becomes the aforementioned first layer, a 30 mm (diameter)×10 mm (thickness) cylindrical sintered substance was prepared, and a 5 mm×5 mm×7 mm (height) prismatic thermoelectric element was prepared.

(Thickness of Tin Concentration Transition Region)

For the thermoelectric conversion materials of Examples 1 to 3 of the present invention, the thickness of the tin concentration transition region was evaluated as below.

The junction interface between the first layer and the second layer of the thermoelectric conversion material was observed using a scanning electron microscope Quanta 450 FEG manufactured by FEI Company by causing the first layer to be on the left side in the field of view for measurement and the second layer to be on the right side in the field of view for measurement. Furthermore, in a field of view (23 μm long and 30 μm wide) at 5,000× magnification, a Sn mapping image was obtained using EDX of a Genesis series manufactured by EDAX. In the image, a region in which the Sn concentration was 0.5 wt % to X wt % was regarded as a tin concentration transition region, and the area of the region was calculated. Herein, X represents a value which equals 95% of the Sn concentration of the second layer of the thermoelectric conversion material. For determining the Sn concentration of the second layer of the thermoelectric conversion material, in a position 100 μm distant from the junction surface of the first layer and the second layer of the thermoelectric conversion material toward the second layer, the Sn concentration was measured at 10 points by using the same device, and the average was taken as the Sn concentration of the second layer.

In addition, the calculated area of the tin concentration transition region was divided by the dimensions of the length and width of the field of view for measurement, and the average of the values obtained from 5 fields of view was taken as the thickness of the tin concentration transition region. The evaluation results are shown in Table 1.

(Open Voltage)

Figure 9:
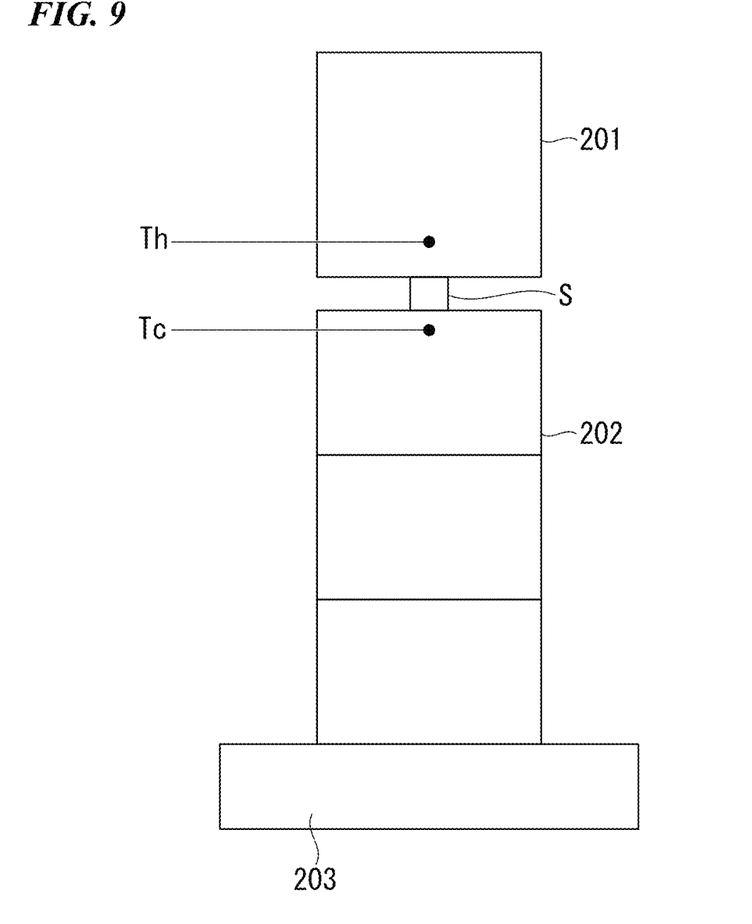
FIG. 9 is a view schematically illustrating a device measuring open voltage in examples.

By using a device for measuring power generation efficiency of a thermoelectric module, open voltage was measured. FIG. 9 schematically shows the device. As a measurement sample S, the thermoelectric conversion materials (5 mm×5 mm×7 mm (height)) of Examples 1 to 3 of the present invention described above and a comparative example were used.

The measurement sample S was interposed between a heating block 201 and a heat flux block 202. While the heating block 201 was being heated, the heat flux block 202 was cooled to a temperature of about 10° C. by using a chiller 203, such that a temperature difference shown in Table 1 was caused between the heating block 201 and the heat flux block 202. A temperature (Th) of the high-temperature side is the temperature of the heating block 201, and a temperature (Tc) of the low-temperature side is the temperature of the heat flux block 202 on the measurement sample S side.

The heating block 201 and the heat flux block 202 were electrically insulated from each other by aluminum nitride (AlN). In this state, terminals for measuring voltage and current were provided on the high-temperature side and the low-temperature side of the measurement sample S, a back electromotive force was applied to the measurement sample S, and the open voltage was measured from zero current (maximum voltage) to a maximum current (zero voltage). In the present invention, the open voltage at zero current was evaluated. The evaluation results are shown in Table 1.

In Examples 2 and 3 of the present invention in which the second layer directly joined to the first layer was formed by solid phase sintering, the thickness of the tin concentration transition region was smaller and varied less, compared to Example 1 of the present invention in which the second layer directly joined to the first layer was formed by liquid phase sintering.

From the above results, it was confirmed that according to the examples of the present invention, an open voltage higher than that in the comparative example can be obtained, and the thermoelectric conversion efficiency is improved.

REFERENCE SIGNS LIST 10 thermoelectric conversion element
11 magnesium-based thermoelectric conversion material
12a, 12b metallized layer
13a, 13b electrodes
14 first layer
15 second layer
16 tin concentration transition region

The invention claimed is:

1. A magnesium-based thermoelectric conversion element, comprising:
a magnesium-based thermoelectric conversion material; and
electrodes joined to one surface and the other surface, facing the one surface, of the magnesium-based thermoelectric conversion material,
wherein the magnesium-based thermoelectric conversion material includes:
a first layer formed of $Mg_2Si$; and
a second layer formed of $Mg_2Si_xSn_{1-x}$, wherein x is greater than 0 and less than 1,
wherein the first layer and the second layer are directly joined to each other,
within a junction surface with the first layer and in a range equal to or greater than 1 μm and equal to or smaller than 50 μm in a lamination direction from the junction surface, the second layer has a tin concen-

TABLE 1

| | | Element constitution | High-temperature portion Th ° C. | Low-temperature portion Tc ° C. | Temperature difference Th − Tc ° C. | Open voltage mV | Average thickness of transition region μm | Maximum thickness μm | Minimum thickness μm |
|---|---|---|---|---|---|---|---|---|---|
| Examples of present invention | 1 | $Mg_2Si$ (0.5% Sb)/$Mg_2Si0.4Sn0.6$(0.5% Sb) | 343.8 | 12.6 | 331.2 | 63.11 | 11.9 | 45.8 | 6.0 |
| | 2 | $Mg_2Si$ (1.0% Sb)/$Mg_2Si0.5Sn0.5$(0.3% Sb) | 356.3 | 11.5 | 344.8 | 71.74 | 4.7 | 7.6 | 2.6 |
| | 3 | $Mg_2Si$ (1.0% Sb)/$Mg_2Si0.5Sn0.5$(0.3% Sb) | 490.4 | 11.5 | 478.9 | 108.94 | 4.7 | 7.6 | 2.6 |
| Comparative Example | | $Mg_2Si$ (0.5% Sb) | 362.5 | 14.3 | 348.2 | 46.21 | — | — | — |

In the comparative example, the open voltage was 46.21 mV under the condition of a temperature difference of 348.2° C.

On the contrary, in Example 1 of the present invention, the open voltage was 63.11 mV under the condition of a temperature difference of 331.2° C., and in Example 2 of the present invention, the open voltage was 71.74 mV under the condition of a temperature difference of 344.8° C. Under the same condition of a temperature difference, a higher open voltage could be obtained in Examples 1 and 2 of the present invention than in the comparative example.

In Example 3 of the present invention, under the condition of a temperature difference of 478.9° C., the open voltage was 108.94 mV, which is an extremely high value.

tration transition region in which a tin concentration increases as a distance from the junction surface increases, and
a region in which the Sn concentration is 0.5% by mass to Y % by mass is regarded as the tin concentration transition region, and Y represents a value which equals 95% of a Sn concentration of the second layer.

2. A thermoelectric conversion device, comprising:
a plurality of the magnesium-based thermoelectric conversion elements according to claim 1,
wherein the magnesium-based thermoelectric conversion elements are arranged to be electrically connected to each other in series through the electrodes.

3. The magnesium-based thermoelectric conversion element according to claim 1, wherein x is equal to or greater than 0.37 and less than 1.

* * * * *